US008889997B2

(12) United States Patent
Liu et al.

(10) Patent No.: US 8,889,997 B2
(45) Date of Patent: Nov. 18, 2014

(54) METHODS FOR IMPROVING CORROSION RESISTANCE AND APPLICATIONS IN ELECTRICAL CONNECTORS

(75) Inventors: Zhengwei Liu, Hershey, PA (US); Min Zheng, Harrisburg, PA (US); Rod Martens, Mechanicsburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 429 days.

(21) Appl. No.: 13/461,135

(22) Filed: May 1, 2012

(65) Prior Publication Data

US 2013/0292161 A1    Nov. 7, 2013

(51) Int. Cl.
*H05K 1/11*    (2006.01)
*H05K 3/02*    (2006.01)
*H05K 3/10*    (2006.01)

(52) U.S. Cl.
USPC .............. 174/261; 174/257; 174/258; 29/846

(58) Field of Classification Search
USPC ..................... 174/255–261; 29/846
See application file for complete search history.

(56) References Cited

U.S. PATENT DOCUMENTS

2011/0206946 A1    8/2011    Schmidt et al.
2013/0048354 A1*    2/2013    Lin et al. ...................... 174/257

FOREIGN PATENT DOCUMENTS

DE    102004028031 A1    1/2006

OTHER PUBLICATIONS

Chang Goo Kang et al: "Enhanced Current Drivability of CVD Graphene Interconnect in Oxygen-Deficient Environment", IEEE Electron Device Letters, IEEE Service Center, New York, NY, US, vol. 32, No. 11, Nov. 1, 2011, pp. 1591-1592, Section II.
International Search Report issued in related PCT application No. PCT/US2013/035413 on Jul. 2, 2013.

* cited by examiner

*Primary Examiner* — Jeremy C Norris

(57) ABSTRACT

A method of manufacturing an electrical conductor includes providing a substrate layer, depositing a graphene layer on the substrate layer and selectively depositing boundary cappings on defects of the graphene layer to inhibit corrosion of the substrate layer at the defects. Optionally, the boundary cappings may include nano-sized crystals deposited only at the defects. The selectively depositing may include electrodepositing boundary cappings on exposed portions of the substrate layer at the defects. The selectively depositing may include reacting boundary capping material with exposed portions of the substrate layer at the defects to deposit the boundary cappings only at the defects.

20 Claims, 2 Drawing Sheets

METHODS FOR IMPROVING CORROSION RESISTANCE AND APPLICATIONS IN ELECTRICAL CONNECTORS

BACKGROUND OF THE INVENTION

The subject matter herein relates generally to methods for improving corrosion resistance and applications in electrical connectors.

Electrical conductors have many forms, such as a contact, a terminal, a pin, a socket, an eye-of-needle pin, a micro-action pin, a compliant pin, a wire, a cable braid, a trace, a pad and the like. Such electrical conductors are used in many different types of products or devices, including electrical connectors, cables, printed circuit boards, and the like. The metals used in the electrical conductors are susceptible to corrosion, diffusion or other reactions, limiting their use or requiring protective coatings. For example, when copper or copper alloy electrical conductors are used, such conductors are susceptible to corrosion. Corrosion of base metals is detrimental to the conductor interface and signal integrity. A gold surface layer is typically applied to the copper as a corrosion inhibitor. However, the gold surface layer adds expense to the electrical conductor.

Grapheme has shown to be promising in electronics devices as a corrosion resistance layer due to the conductivity and chemically stable nature of graphene. However, grain boundaries and other defects of the graphene layer are weak points vulnerable to corrosion attacks. The cost to manufacture large graphene grains, having less boundary area and fewer defects, are extremely high and time consuming to manufacture.

A need remains for an electrical conductor that addresses the aforementioned problems and other shortcomings associated with traditional electrical conductors.

BRIEF DESCRIPTION OF THE INVENTION

In one embodiment, a method of manufacturing an electrical conductor includes providing a substrate layer, depositing a graphene layer on the substrate layer and selectively depositing boundary cappings on defects of the graphene layer to inhibit corrosion of the substrate layer at the defects.

Optionally, the boundary cappings may include nano-sized crystals deposited only at the defects. The selectively depositing may include electrodepositing boundary cappings on exposed portions of the substrate layer at the defects. The selectively depositing may include reacting boundary capping material with exposed portions of the substrate layer at the defects to deposit the boundary cappings only at the defects. The selectively depositing may include selectively depositing boundary cappings of nano-sized crystals of precious metal using a process that reacts the nano-sized crystals of precious metals with the substrate layer exposed at the defects and that does not react the nano-sized crystal of precious metal with the graphene layer.

Optionally, the selectively depositing may include an atomic layer deposition process in select locations at the defects or a self-assembled monomer process in select locations at the defects. The selectively depositing may include providing a precursor that reacts with the substrate layer and the boundary capping material and that does not react with the graphene layer to selectively deposit the boundary capping material at the locations of the defects where the substrate layer is exposed. The selectively depositing may include filling the defects with boundary capping material such that the boundary capping material is deposited directly on the substrate layer in the graphene layer.

Optionally, the depositing a graphene layer on the substrate layer may include depositing of graphene layer with defect-free areas between defects of the graphene layer. The selectively depositing may include selectively depositing boundary cappings on the defects with the defect-free areas largely devoid of boundary cappings.

In another embodiment, a method of manufacturing an electrical conductor includes providing a substrate layer, depositing a graphene layer on the substrate layer having defects exposing the substrate layer, and decorating the defects with metal boundary cappings. The defects are decorated with the metal boundary cappings using an electrodeposition process where nano-size crystals of the metal boundary cappings are deposited at the exposed portions of the substrate layer.

In a further embodiment, an electrical conductor is provided having a substrate layer, a graphene layer deposited on the substrate layer having defects exposing the substrate layer, and boundary cappings at the defects. The boundary cappings inhibit corrosion of the substrate layer at the defects.

DETAILED DESCRIPTION OF THE INVENTION

Figure 1:
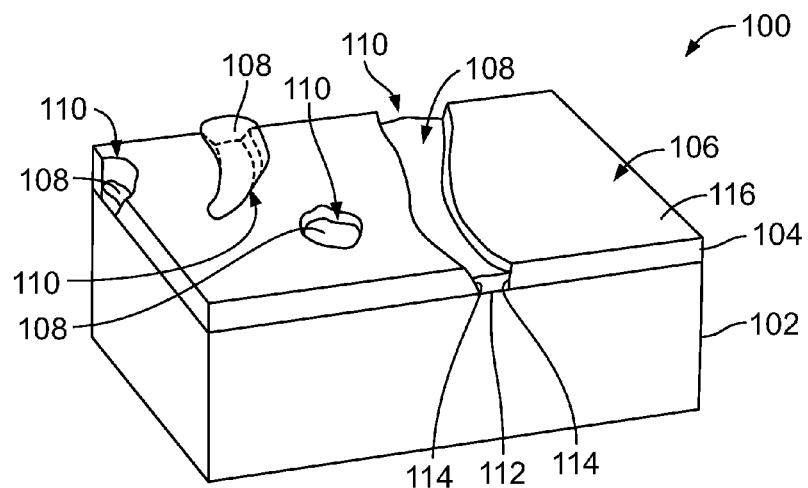
FIG. 1 is a cross sectional view of a portion of an electrical conductor formed in accordance with an exemplary embodiment.

FIG. 1 is a cross sectional view of a portion of an electrical conductor 100 formed in accordance with an exemplary embodiment. The electrical conductor 100 may be any type of electrical conductor, such as a contact, a terminal, a pin, a socket, an eye-of-the-needle pin, a micro-action pin, a compliant pin, a wire, a cable braid, a trace, a pad and the like. The electrical conductor 100 may form part of an electrical connector, a cable, a printed circuit board and the like.

In an exemplary embodiment, the electrical conductor 100 is a multi-layered structure having a substrate layer 102 and a surface layer 104. The substrate layer 102 is a metal substrate (e.g. copper, copper alloy, nickel or nickel alloy). The substrate layer 102 may be a multi-layered structure. In an exemplary embodiment, the substrate layer 102 is electrically conductive and includes a metal compound, such as a copper or a copper alloy. Other metal compounds for the substrate layer 102 may include nickel, nickel alloy, steel, steel alloy, aluminum, aluminum alloy, palladium-nickel, tin, tin alloy, cobalt, tungsten, platinum, palladium, carbon, graphite, graphene, carbon-based fabric, or any other conductive material. Optionally, the substrate layer 102 may include one or more barrier layers that provide a diffusion barrier between the metal of the metal substrate and the surface layer 104.

In an exemplary embodiment, the surface layer 104 provides a corrosion-resistant electrically conductive layer on the substrate layer 102. The surface layer 104 protects the substrate layer 102, such as from corrosion, and/or enhances the characteristics of the substrate layer 102, such as by reducing friction enhancing wear resistance, and the like. In an exemplary embodiment, the surface layer 104 includes a graphene layer 106 deposited on the substrate layer 102 and boundary cappings 108 selectively deposited on the graphene layer 106 and/or the substrate layer 102. The graphene layer 106 is provided on the substrate layer 102 to inhibit corrosion of the substrate layer 102. The boundary cappings 108 are provided to fill, either partially or entirely, defects 110 in the graphene layer 106 to inhibit corrosion in the area of the defects 110. Other types of carbon-based structures, such as a layer of carbon nanotubes (CNTs), a graphite oxide structure, and the like may be used rather than graphene in the surface layer 104. The carbon-based structures are electrically conductive and provide corrosion resistance as well as other features. In an exemplary embodiment, the carbon-based structure is used on a copper base in-lieu of traditional nickel and gold platings on the copper base.

The surface layer 104 is generally a thin layer, as compared to the substrate layer 102. The surface layer 104 may be deposited on the substrate layer 102 by any known process, such as deposition, plating, adhering, and the like. Optionally, the surface layer 104 may be deposited directly on the underlying substrate layer 102. Alternatively, one or more other layers may be provided between the surface layer 104 and the substrate layer 102. Optionally, the surface layer 104 may include a coating either exterior of or interior of the graphene layer. The coating may be a metal compound coating such as gold, silver, tin, palladium, nickel, palladium-nickel, platinum and the like.

The surface layer 104 may include defects 110 that expose the substrate layer 102. The defects 110 are formed during the forming or depositing process. For example, the defects 110 may form at triple points, grain boundaries of the graphene layer 106, scratches in the graphene layer 106, and the like. The size, shape and amount of defects 110 may depend on many factors, such as the grain size of the graphene, the method of growing or forming the graphene, contamination and the like. The defects 110 expose the substrate layer 102, which may lead to corrosion of the substrate layer 102 if left exposed. The boundary cappings 108 are selectively deposited only at the defects 110 as opposed to across the entire surface layer 104 to save cost of manufacture. The boundary cappings 108 inhibit corrosion in areas where the substrate layer 102 would otherwise be exposed or susceptible to corrosion.

The defects 110 have a bottom 112, exposing the substrate layer 102, and sides 114 extending through the surface layer 104 from the bottom 112 to a top 116 of the surface layer 104 (the terms bottom and top are relative to a particular orientation of the electrical conductor and more generally constitute interior and exterior, respectively). The sides 114 are exposed within the defects 110. While the defects 110 are represented graphically in FIG. 1 as being rectangular, it is realized that the defects 110 may have any shape, and typically will have a complex shape. For example, the sides 114 may be non-planar and may be irregular in shape. The boundary cappings 108 are illustrated as entirely filling the defects 110, however the boundary cappings 108 may only partially fill the defects 110 and still cap the defect 110 to inhibit corrosion of the substrate layer 102. In an exemplary embodiment, the boundary cappings 108 directly engage the substrate layer 102 at the bottom 112.

In an exemplary embodiment, the graphene layer 106 is the outermost layer of the electrical conductor 100. The graphene layer 106 may reduce friction on the outermost surface of the electrical conductor 100, which may make mating of the electrical conductor 100 easier. The graphene layer 106 may reduce stiction of the surface layer 104. The reduction in stiction may allow use of the electrical conductor 100 in fields or devices that previously were unsuitable for electrical conductors 100 having problems with stiction and/or cold welds, such as electrical conductors having the outermost layer being a gold layer. For example, in microelectromechanical systems (MEMS) switches, stiction is a problem when a gold layer is the outermost layer of the electrical conductor. Coating the surface layer 104 with the graphene layer 106 reduces the stiction of the electrical conductor 100, making the electrical conductor suitable for use in MEMS switches.

Figure 2:
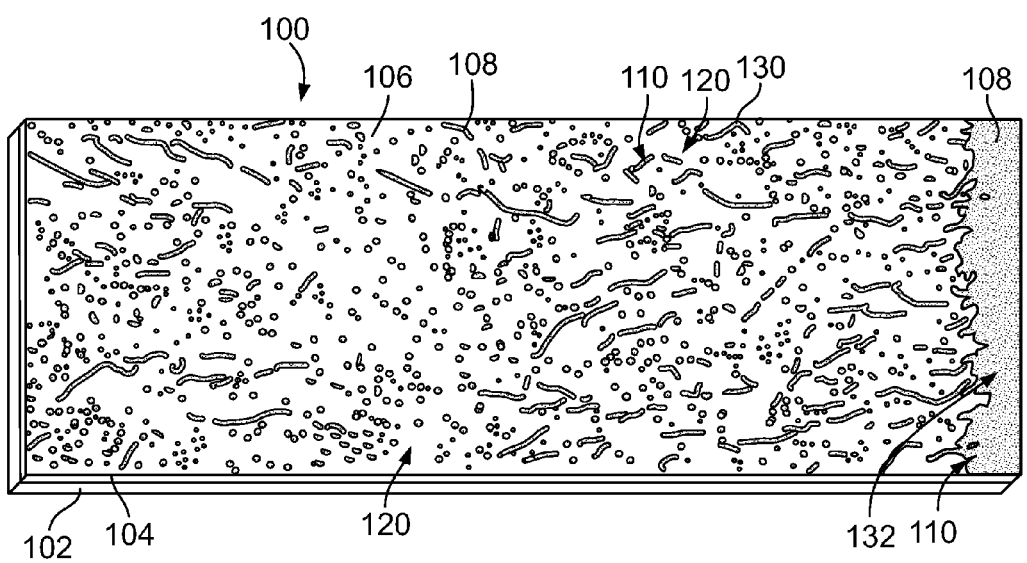
FIG. 2 is a top view of a portion of the electrical conductor 100 showing a graphene layer and boundary cappings to inhibit corrosion of the electrical conductor.
Figure 3:
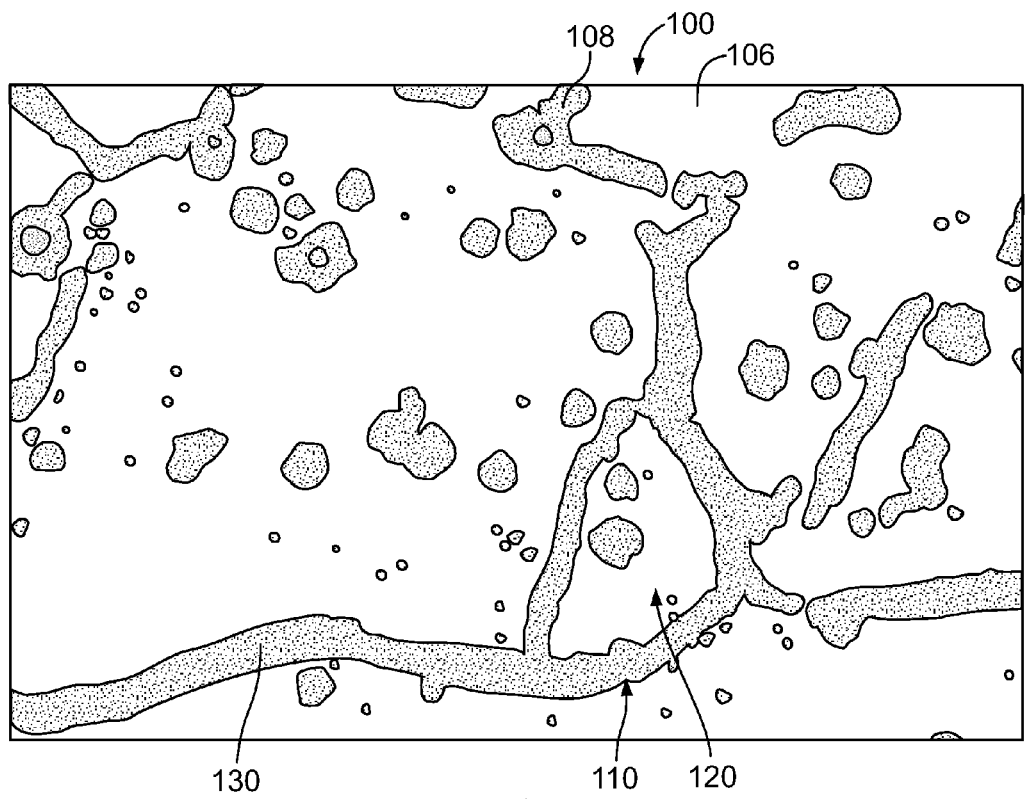
FIG. 3 is an enlarged view of a portion of the electrical conductor shown in FIG. 2.

FIG. 2 is a top view of a portion of the electrical conductor 100 showing the graphene layer 106 and the boundary cappings 108 to inhibit corrosion of the electrical conductor 100. FIG. 3 is an enlarged view of a portion of the electrical conductor 100 shown in FIG. 2. The graphene layer 106 is electrically conductive. The graphene layer 106 is deposited on the substrate layer 102. In an exemplary embodiment, the graphene layer 106 is grown on the substrate layer 102. For example, the electrical conductor 100 is processed to grow the graphene layer 106 on the entire surface of the substrate layer 102 or in select locations of the substrate layer 102.

In an exemplary embodiment, the graphene layer 106 may be formed during a chemical vapor deposition (CVD) process in the presence of an organic compound, such as gaseous methane, at a high temperature, such as approximately 800° C. Deposition mechanisms may also include electron beam, microwave or other process within the vaporous atmosphere. Other processes may be used to deposit the graphene layer 106, such as laser deposition, plasma deposition or other techniques or processes. Optionally, the graphene layer 106 may be 1 atomic layer thick on the substrate layer 102. Alternatively, the graphene layer 106 may be thicker. In an exemplary embodiment, the graphene layer 106 is deposited directly on the substrate layer 102 using the metal compound of the substrate layer 102 as a catalyst during the CVD process (or other process) to promote graphene growth at the interface with the substrate layer 102. The type of organic compound or gas precursor used, the pressure of the gas precursor used, the flow rate of the gas precursor, the temperature of the process, or other factors may be selected to promote graphene growth on the particular metal type used for the metal substrate.

During the graphene growth, the defects 110 (shown in FIG. 1) naturally occur. For example, the defects 110 are defined at the grain boundaries 130, scratches 132 of the graphene layer 106, pin-hole defects, contamination and the like. The defects 110 may have any size or shape. The scratch 132 almost entirely removes the graphene layer 106 in such area. The grain boundaries 130 have line structures and isolated islands. In an exemplary embodiment, defect-free areas 120 are defined between the defects 110. The defect-free areas 120 are defined by the graphene structure and provide blanket coverage of the substrate layer 102 below the defect free areas 120. The defect-free areas 120 define a much larger surface area of the surface layer 104 than the defects 110. The defects 110 tend to expose the underlying metal substrate of the substrate layer 102. If left uncapped, corrosion of the substrate layer 102 may occur at the defects 110. Selective deposition of the boundary cappings 108 at the defects 110 inhibits corrosion at the defects 110. The surface layer 104 as a whole, including the graphene layer 106 and the boundary cappings 108 provide better corrosion resistance than a surface layer without boundary cappings.

The boundary cappings 108 may be electrically conductive. For example, the boundary cappings 108 may be metal crystals, such as precious metal crystals of nano-size or larger. The boundary cappings 108 may be carbon-based structures, such as graphene having smaller grain-size than the graphene layer 106 to allow for growth in the defects 110. In an exemplary embodiment, the boundary cappings 108 are deposited directly on the substrate layer 102, such as the exposed portions of the substrate layer 102 within the defects 110. The boundary cappings 108 inhibit corrosion of the exposed portion of the substrate layer 102 at the defects 110. In an exemplary embodiment, the electrical conductor 100 is processed to grow the boundary cappings 108 in select locations (e.g. on the exposed substrate layer 102 within the defects 110). The boundary cappings 108 constitute deposits that are embedded in the graphene layer 106. The boundary cappings 108 cap the defects 110, such as by plugging the voids left by the defects 110. In an exemplary embodiment, the boundary cappings 108 cover the bottoms 112 (shown in FIG. 1) of the defects 110.

In an exemplary embodiment, the boundary cappings 108 may be formed during an electrodeposition process. The boundary cappings 108 may be formed from precious metal nanocrystals deposited directly on the substrate layer 102 at the defects 110. For example, the boundary cappings 108 may include gold, silver, platinum or other types of precious metals. The boundary cappings 108 may be deposited only on the exposed portions of the substrate layer 102 within the defects 110. For example, the materials at the defects 110 may be more chemically active than the graphene at the defect-free areas 120. Nucleation of the material of the boundary cappings 108 occurs at the defects 110. The metal compound of the substrate layer 102 may be used to promote electrodeposition of the metal nanocrystals during the process to promote boundary capping 108 deposition at the interface with the substrate layer 102 as compared to other layers, such as the graphene layer 106. As such, the boundary cappings 108 may be selectively deposited on the electrical conductor 100 at the defects 110 as opposed to a blanket covering of the entire graphene layer 106, which reduces the manufacture time, materials and cost. The boundary cappings 108 provide corrosion resistance.

The boundary cappings 108 may be formed by other types of selective deposition processes in alternative embodiments. For example, the boundary cappings 108 may be formed by atomic layer deposition, selective absorption or self assembled monomer deposition where an oxide or other inert material is selectively deposited at the defects 110. Having an electrically insulating material just at the defects 110 would have only a small effect on the bulk conductivity of the electrical conductor 100. The atomic layer deposition and self assembled monomer deposition processes may use a precursor that selectively reacts with the exposed portion of the substrate layer to deposit the boundary cappings 108 at the defects 110. In other alternative embodiments, the boundary cappings 108 may be deposited using a chemical reduction reaction or chemical vapor deposition (CVD) process, such as in the presence of an organic compound, such as gaseous methane, at a high temperature, such as approximately 800° C. Deposition mechanisms may also include electron beam, microwave or other process within the vaporous atmosphere. Other processes may be used to deposit the boundary cappings 108, such as laser deposition, plasma deposition or other techniques or processes. Optionally, the boundary cappings 108 may be 1 atomic layer thick in the defects 110.

Figure 4:
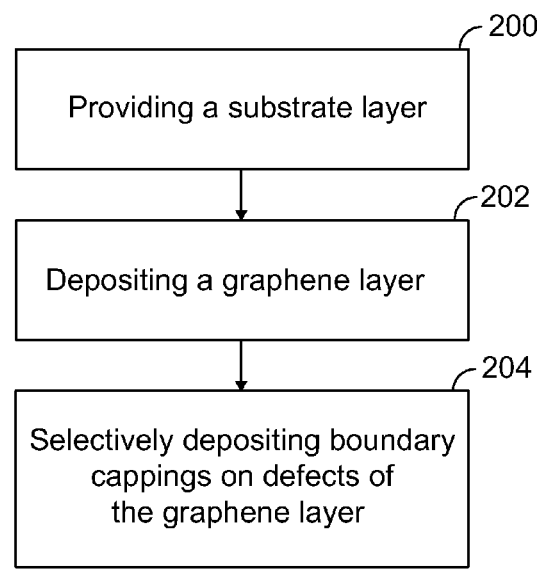
FIG. 4 is a flow chart of an exemplary method of manufacture of an electrical conductor.

FIG. 4 is a flow chart showing an exemplary method of manufacture of an electrical conductor, such as the electrical conductor 100. The method includes providing 200 a substrate layer, such as the substrate layer 102. The substrate layer may be a copper or copper alloy layer.

The method includes depositing 202 a graphene layer, such as the graphene layer 106, on the substrate layer. The graphene layer may be formed by an electrodepositing process, a CVD process, a bonding process or another process. The graphene layer may completely cover the substrate layer or may selectively cover portions of the substrate layer. The graphene layer may be formed by growing or depositing one or more graphene layers on the substrate layer. The substrate layer may act as a catalyst to promote growth of the graphene thereon.

The method includes selectively depositing 204 boundary cappings, such as the boundary cappings 108, on defects of the graphene layer to inhibit corrosion of the substrate layer at the defects. The boundary cappings may be deposited on the substrate layer and/or the graphene layer. The boundary cappings may be deposited by an electrodepositing process, a CVD process, a bonding process an atomic layer deposition process, a self assembled monomer deposition process or another process. The boundary cappings may be formed by growing or depositing one or more boundary capping material in the graphene layer at the defects. The substrate layer may act as a catalyst to promote growth or deposition of the boundary capping material at the exposed portions of the substrate layer exposed by the defects. The boundary capping material may be electrically conductive or may be electrically insulative. In an exemplary embodiment, the boundary capping material is a precious metal material and nano-size crystals of the precious metal are deposited during the depositing process. The boundary capping material may be graphene or may be an oxide or an inert material. Once the defects are capped by the boundary capping material, the substrate layer is no longer exposed (or at least is less exposed) making the substrate layer less susceptible to corrosion.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second" and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical conductor comprising:
   a substrate layer;
   a graphene layer deposited on the substrate layer, the graphene layer having defects exposing the substrate layer; and boundary cappings at the defects, the boundary cappings inhibit corrosion of the substrate layer at the defects.

2. The electrical conductor of claim 1, wherein the boundary cappings comprise nano-sized crystals deposited only at the defects.

3. The electrical conductor of claim 1, wherein the boundary cappings are electrodeposited on exposed portions of the substrate layer at the defects.

4. The electrical conductor of claim 1, wherein the exposed portions of the substrate layer at the defects act as a catalyst to react with the boundary capping material to deposit the boundary cappings only at the defects.

5. The electrical conductor of claim 1, wherein the boundary cappings are electrically conductive.

6. The electrical conductor of claim 1, wherein the boundary cappings are electrically insulative.

7. The electrical conductor of claim 1, wherein the boundary cappings are embedded within the graphene layer and directly engage the exposed portions of the substrate layer at a bottom of the defect.

8. A method of manufacturing an electrical conductor, the method comprising:
providing a substrate layer;
depositing a graphene layer on the substrate layer; and
selectively depositing boundary cappings on defects of the graphene layer to inhibit corrosion of the substrate layer at the defects.

9. The method of claim 8, wherein the boundary cappings comprise nano-sized crystals deposited only at the defects.

10. The method of claim 8, wherein said selectively depositing boundary cappings comprises electrodepositing boundary cappings on exposed portions of the substrate layer at the defects.

11. The method of claim 8, wherein said selectively depositing boundary cappings comprises reacting boundary capping material with exposed portions of the substrate layer at the defects to deposit the boundary cappings only at the defects.

12. The method of claim 8, wherein said selectively depositing boundary cappings comprises selectively depositing boundary cappings of nano-sized crystals of precious metal using a process that reacts the nano-sized crystals of precious metal with the substrate layer exposed at the defects and that does not react the nano-sized crystal of precious metal with the graphene layer.

13. The method of claim 8, wherein said selectively depositing boundary cappings comprises an atomic layer deposition process in select locations at the defects.

14. The method of claim 8, wherein said selectively depositing boundary cappings comprises a self-assembled monomer process in select locations at the defects.

15. The method of claim 8, wherein said selectively depositing boundary cappings comprises providing a precursor that reacts with the substrate layer and the boundary capping material and that does not react with the graphene layer to selectively deposit the boundary capping material at the locations of the defects where the substrate layer is exposed.

16. The method of claim 8, wherein said selectively depositing boundary cappings comprises filling the defects with boundary capping material such that the boundary capping material is deposited directly on the substrate layer in the graphene layer.

17. The method of claim 8, wherein said depositing a graphene layer on the substrate layer comprises depositing of graphene layer with defect-free areas between defects of the graphene layer, said selectively depositing boundary cappings comprises selectively depositing boundary cappings on the defects with the defect-free areas largely devoid of boundary cappings.

18. A method of manufacturing an electrical conductor, the method comprising:
providing a substrate layer;
depositing a graphene layer on the substrate layer, the graphene layer having defects exposing the substrate layer; and
decorating the defects with metal boundary cappings using an electrodeposition process where crystals of the metal boundary cappings are deposited at the exposed portions of the substrate layer.

19. The method of claim 18, wherein said decorating comprises reacting boundary capping material with exposed portions of the substrate layer at the defects to deposit the boundary cappings only at the defects.

20. The method of claim 18, wherein said decorating comprises selectively depositing boundary cappings of nano-sized crystals of precious metal using the electrodeposition process to react the nano-sized crystals of precious metal with the substrate layer exposed at the defects.

* * * * *